United States Patent
Toda

(10) Patent No.: US 6,626,685 B2
(45) Date of Patent: Sep. 30, 2003

(54) CARD CONNECTOR COVER AND CARD CONNECTOR ASSEMBLY

(75) Inventor: Shinsaku Toda, Kanagawa (JP)

(73) Assignee: Tyco Electronics. AMP, K.K., Kanagawa (JP)

( * ) Notice: Subject to any disclaimer, the term of this patent is extended or adjusted under 35 U.S.C. 154(b) by 0 days.

(21) Appl. No.: 09/813,771

(22) Filed: Mar. 20, 2001

(65) Prior Publication Data

US 2001/0024901 A1 Sep. 27, 2001

(30) Foreign Application Priority Data

Mar. 21, 2000 (JP) ........................................ 2000-078821

(51) Int. Cl.[7] .............................................. H01R 4/66
(52) U.S. Cl. ........................ 439/92; 439/497; 439/607; 439/328
(58) Field of Search ............................. 439/92, 64, 95, 439/74, 327, 328, 607, 497

(56) References Cited

U.S. PATENT DOCUMENTS

| 5,470,238 A | * | 11/1995 | Walden | 439/98 |
|---|---|---|---|---|
| 5,484,302 A | | 1/1996 | Yamada et al. | 439/326 |
| 5,940,275 A | * | 8/1999 | Laity | 361/737 |
| 6,080,017 A | * | 6/2000 | Yu et al. | 439/607 |
| 6,089,915 A | * | 7/2000 | Ho et al. | 439/607 |
| 6,176,725 B1 | * | 1/2001 | Kobayashi et al. | 439/326 |
| 6,238,240 B1 | * | 5/2001 | Yu | 439/541.5 |
| 6,475,024 B1 | * | 11/2002 | Narui | 439/495 |

FOREIGN PATENT DOCUMENTS

JP   6-88073   12/1994   ......... H01R/13/639

* cited by examiner

Primary Examiner—Tho D. Ta
Assistant Examiner—James R. Harvey

(57) ABSTRACT

The card connector cover 50 of the invention has a planar surface 51 which substantially covers the upper surface of the card connector 10, and securing portions 52 which are installed on this planar surface 51. Springs 56 which contact the surface of the casing C of the electronic device that accommodates the card connector 10 are formed on the planar surface 51. The securing portions 52 fasten in place latches 30 which are disposed on the card connector 10, and which engage with the daughter board. The card connector assembly 1 consists of the card connector 10 and card connector cover 50.

15 Claims, 6 Drawing Sheets

CARD CONNECTOR COVER AND CARD CONNECTOR ASSEMBLY

FIELD OF THE INVENTION

The present invention relates to an electrical connector and a cover for connecting a mother board and a daughter board such as a dual in-line memory module (DIMM) or fax modem card, to each other.

BACKGROUND OF THE INVENTION

Card connectors that connect mother boards and daughter boards such as DIMMs to each other have long been used in electronic devices such as personal computers. Such card connectors are generally equipped with a latching device for securing the daughter board in order to prevent the daughter board from slipping out during use.

For example, the card connector 100 shown in FIG. 6 is known as a conventional card connector that is equipped with a latching device. This card connector 100 is also disclosed in Japanese Utility Model Application Kokai No. H6-88073 and is constructed from a housing 110 that is substantially C-shaped, a plurality of contacts 112 which are disposed in the contact receiving area 113 of the housing 110, and latching devices 120 which are disposed in openings 111 formed in both ends of the housing 110.

As is shown in FIGS. 7(A–C), each latching device 120 has a first arm 121 and a second arm 122 that face each other to form a U-shape. A plurality of projections 121a which are press fit into the opening 111 of the housing 110 are formed on the first part 121. A solder foot 126 extending from the first arm 121 is used for soldering the latching device 120 to the mother board (not shown in the figures). A latch 123 is formed above roughly the center of the second arm 122, and a latch release 124 is formed on the free end of the second arm 122. An arcuate section 125 that contacts a cutout 131 in the daughter board 130 is formed between the latch 123 and second arm 122.

Referring again to FIG. 6, the end of the daughter board 130 is inserted into the contact receiving area 113 at an angle and is then pivoted so that it becomes parallel to the motherboard. The latches 123 engage with the upper surface of the daughter board 130, and the arcuate sections 125 enter the cutouts 131 in the daughter board 130 to secure the daughter board 130 in the card connector 100. In order to release the daughter board 130, it is necessary to press the latch releases 124 in the direction indicated by the arrow A, and move the latches 123 from the latched position to the unlatched position.

Problems have been encountered in this conventional card connector 100. Since the daughter board 130 is secured only by the latches 123 and the arcuate sections 125, it has been found that the daughter board 130 may slip out of the housing 110 in the case of a large impact caused by dropping the device.

To describe this problem in greater detail, a material with a high rigidity has conventionally been used for the casing of the electronic device such as a notebook personal computer that houses the mother board on which the card connector 100 is mounted. As a result, the impact force caused by dropping the casing, in the area around the card connector 100 has a small gravitational acceleration of around 4000 m/s$^2$. However, if a material with a small rigidity is used for the casing in order to reduce costs, the impact force caused by dropping, in the area around the card connector 100 shows an increased gravitational acceleration of around 10,000 m/s$^2$. If such an impact is applied to the area around the card connector 100, there is an increased risk that the daughter board 130 will slip out of the housing 110.

SUMMARY

An object of the present invention is to address this problem by providing a card connector and cover which can prevent the daughter board from slipping out of the housing even when an impact with a gravitational acceleration exceeding 10,000 m/s$^2$ is applied. The card connector cover of the present invention is attached to a card connector and is equipped with a planar surface which substantially covers the upper surface of the card connector, springs that contact the surface of the casing of the electronic device, and securing portions extending from the planar surface for engaging latch members on the connector.

BRIEF DESCRIPTION OF THE DRAWINGS

FIGS. 1(A–D) illustrate an embodiment of the card connector assembly of the present invention wherein FIG. 1(A) is a plan view, FIG. 1(B) is a front view, FIG. 1(C) is a back view, and FIG. 1(D) is a left-side view. In FIGS. 1(B) and 1(C), however, the mother board and the casing of the electronic device are also shown.

FIGS. 2(A–D) show the card connector making up the card connector assembly of FIG. 1 wherein FIG. 2(A) is a plan view, FIG. 2(B) is a front view, FIG. 2(C) is a back view, and FIG. 2(D) is a left-side view.

FIGS. 3(A–C) show one of the latch members used in the card connector of FIG. 2 wherein FIG. 3(A) is a plan view, FIG. 3(B) is a front view, and FIG. 3(C) is a left-side view.

FIGS. 4(A–D) show the card connector cover making up the card connector assembly of FIG. 1 wherein FIG. 4(A) is a plan view, FIG. 4(B) is a front view, FIG. 4(C) is a back view, and FIG. 4(D) is a left-side view.

FIGS. 7(A–C) show the latching device used in the card connector of FIG. 6 wherein FIG. 7(A) is a plan view, FIG. 7(B) is a side view, and FIG. 7(C) is a front view.

DETAILED DESCRIPTION OF THE PREFERRED EMBODIMENT

An embodiment of the present invention will now be described with reference to the attached figures. The card connector assembly 1 shown in FIGS. 1(A–D) consists of a card and a card connector cover 50 which is attached to the card connector 10. In the present embodiment, the daughter board 60 that is received in the card connector 10 is a fax modem card. However, this daughter board 60 may also be some other type of circuit board such as a DIMM or single in-line memory module (SIMM).

Figure 2:
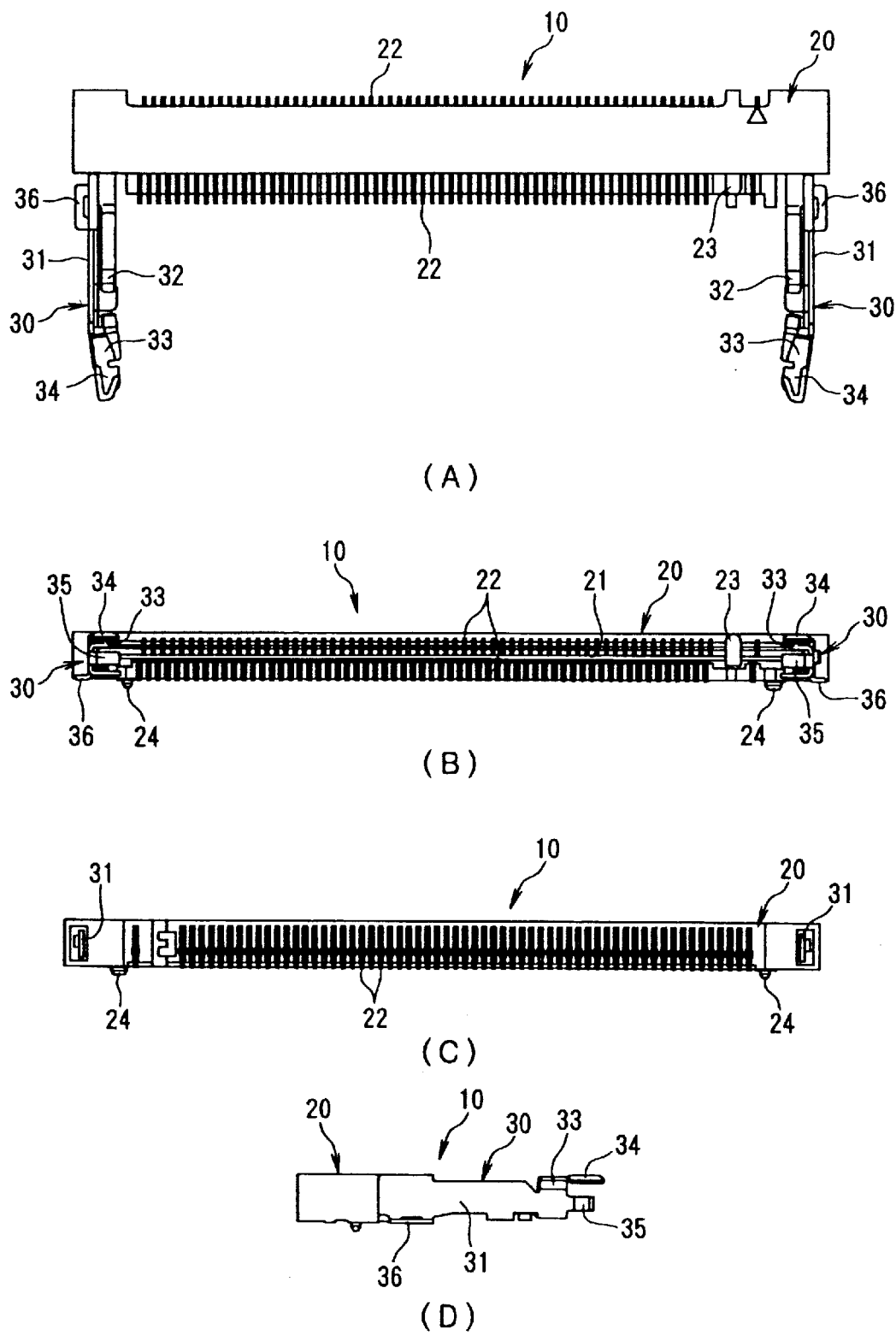

As is shown most clearly in FIGS. 2(A–D), the card connector 10 is equipped with a housing 20 which has a board receiving recess 21, a plurality of contacts 22 which are attached to the board receiving recess 21, and a pair of latch members 30 which are attached to the left and right ends of the housing 20. The housing 20 has a substantially rectangular shape and is preferably formed by molding an insulating resin. A rib 23 on its right end prevents backward insertion of the daughter board 60. A pair of positioning posts 24 are formed on the undersurfaces of the left and right ends of the housing 20.

Each of the plurality of contacts 22 is preferably made by stamping and forming a conductive material, and is arranged so that the contact is preferably soldered at one end to a conductive pad (not shown in the figures) on the mother board. At the other end, each contact 22 contacts a conductive pad (not shown in the figures) on the daughter board 60 when the end of the daughter board 60 is received inside the board receiving recess 21.

Figure 3:
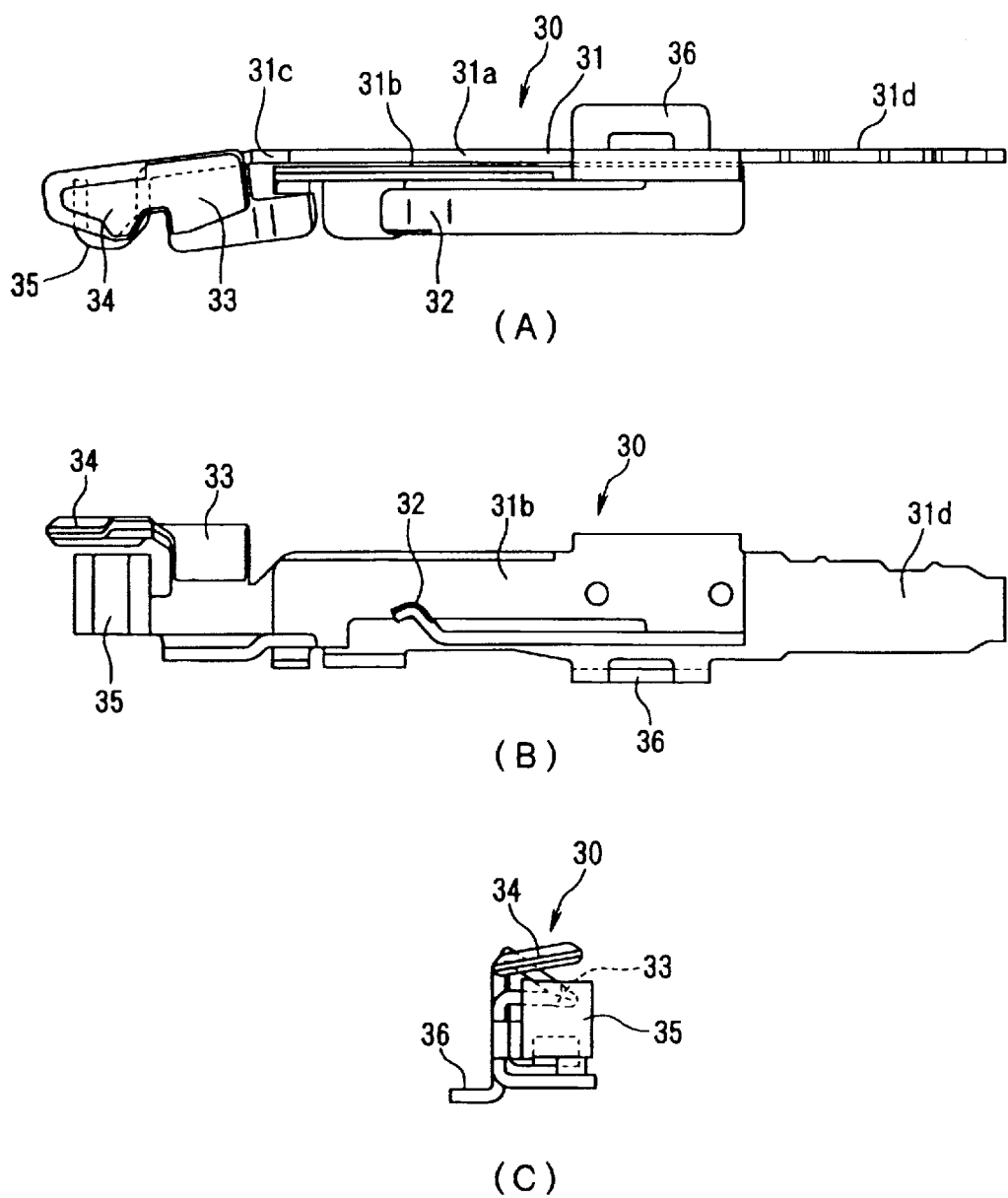

Each of the pair of latch members 30 has one end accommodated in the board receiving recess 21, and engages the inserted daughter board 60. Each latch member 30 is preferably formed by stamping and forming a metal plate. As is shown most clearly in FIG. 3, each latch member 30 has a main body 31 which is formed by folding and overlapping two planar surfaces 31a and 31b. The planar surface 31a on the outside of the main body 31 has a rear end and a front end which is bent slightly inward at a specified point 31c. Furthermore, a securing portion 31d which is press-fitted in the side part of the housing 20 is formed on the rear end of the outside planar surface 31a of the main body 31, and a solder foot 36 is formed by being bent outward. A catch 33 which engages with the upper surface of the daughter board 60, a projection 35 which contacts a cutout (not shown in the figures) formed in the side edge of the daughter board 60, and a release 34, are formed on the front end of the planer surface 31a. A ground contact 32 which contacts a ground disposed on the undersurface of the daughter board 60 extends forward from the rear end of the planar surface 31b.

Figure 4:
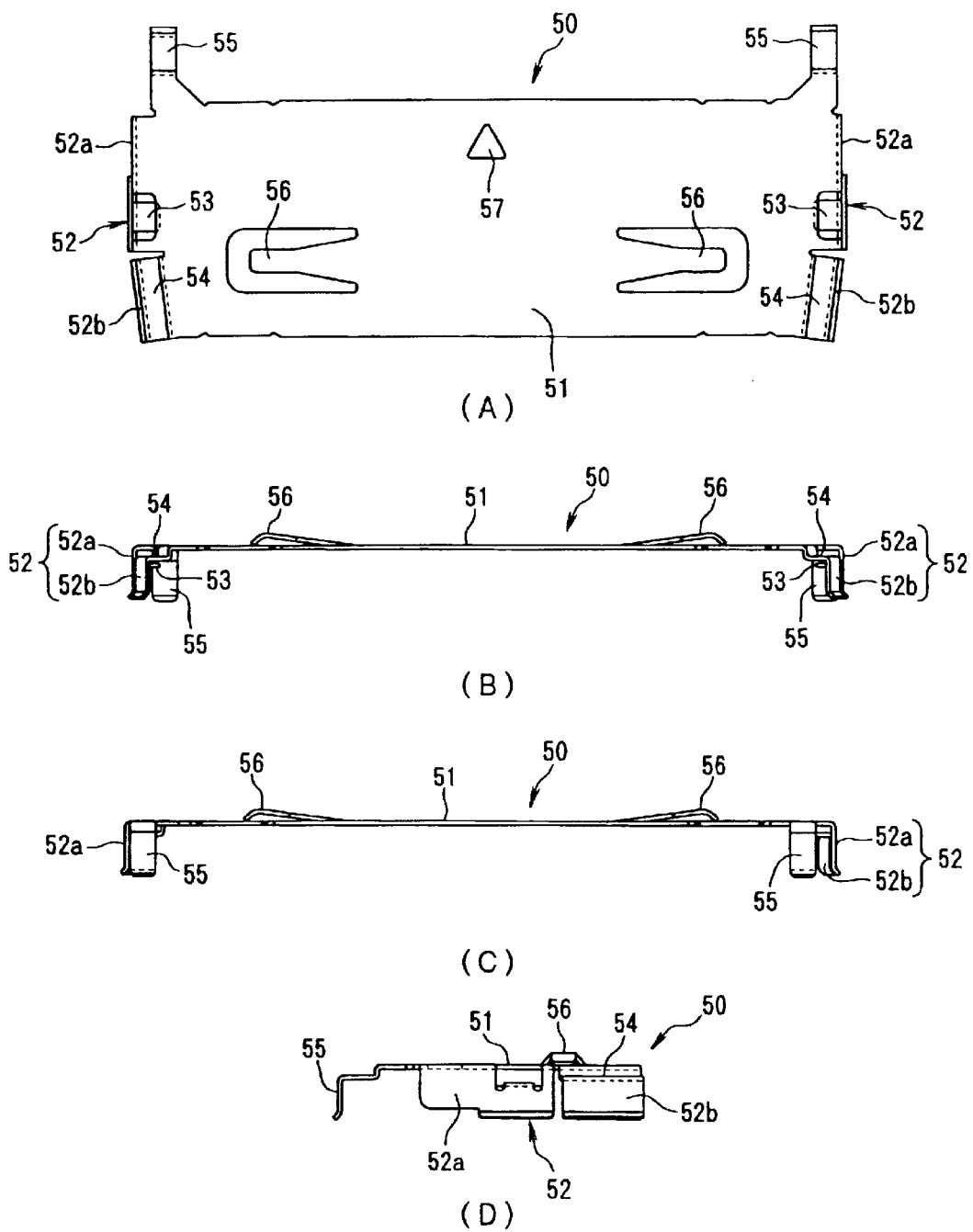

Next, the cover 50 will be described in detail with reference to FIGS. 4(A–D). The cover 50 is formed by stamping and bending a metal plate. This cover 50 is equipped with a planar surface covering the housing 20 including the latch members 30, and a pair of securing portions 52 which are disposed on the left and right ends of the planar surface 51.

The securing portions 52 are respectively formed by being bent downward from the left and right end portions of the planar surface 51, so that they run along the outside surfaces of the planar surfaces 31a. Each securing portion 52 has a rear end retaining plate 52a whose inside surface makes frictional contact with the rear end of the planar surface 31a, and a front end retaining plate 52b whose inside surface similarly makes frictional contact with the front end of the planar surface 31a when the cover 50 is attached to the card connector 10. A main body securing portion 53 which presses against the upper edge of the main body 31 of the latch member 30 is cut and raised inward from the rear end retaining plate 52a. A latch securing portion 54 which presses against the upper ends of the latch release part 34 and catch 33 of the latch member 30 extends inward from the front end retaining plate 52b. This latch securing portion 54 is connected to the planar surface 51 at the other end.

Figure 1:
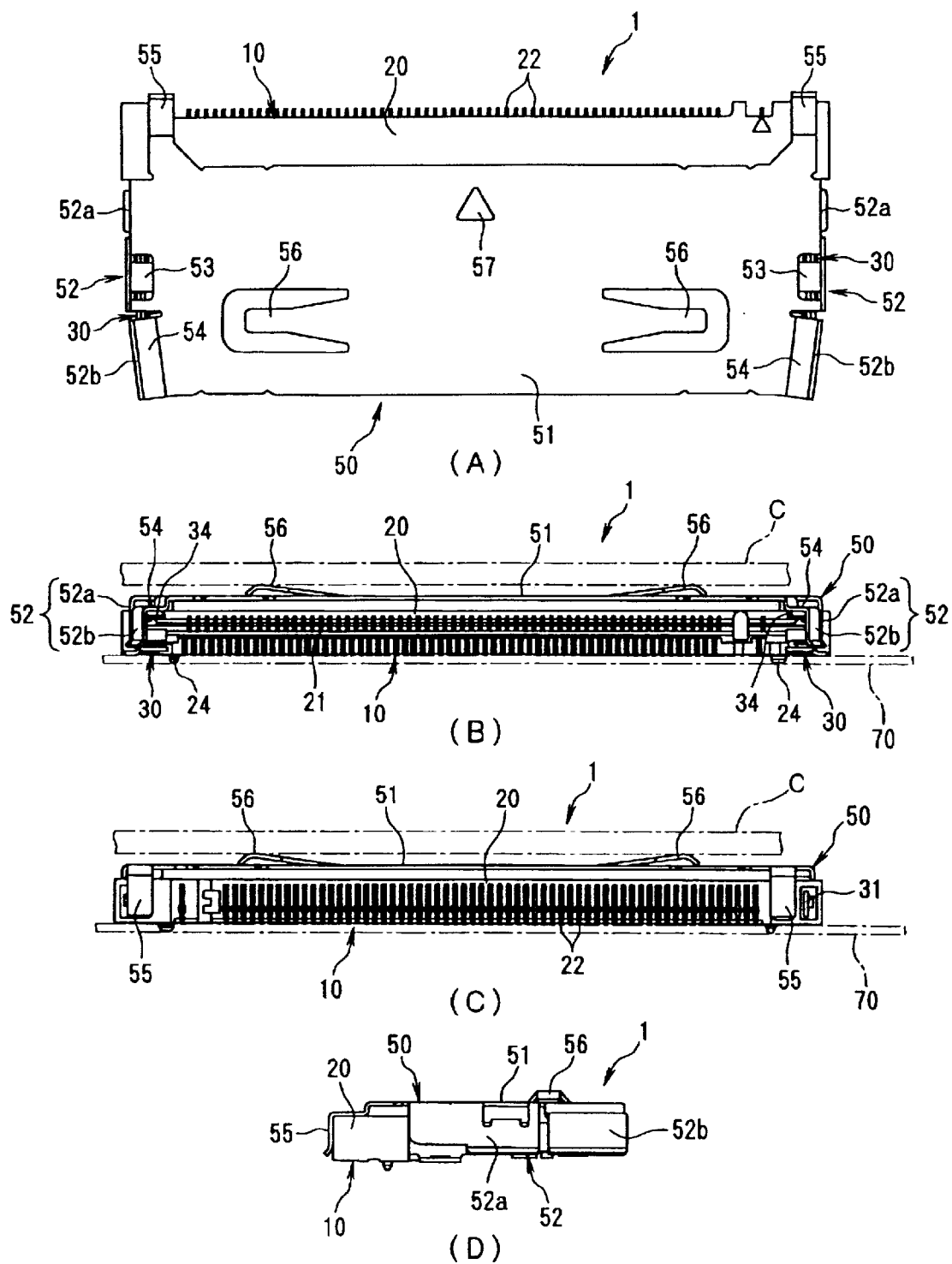

A pair of cantilever springs 56 which extend upward are formed by being cut out and raised from the planar surface 51 near the front side. As is shown in FIGS. 1(B&C), these springs 56 elastically contact the inside surface of the door C of the electronic device that houses the card connector 10. A triangular hole 57 is formed in the center near the rear side of the planar surface 51. This triangular hole 57 functions as a mark that prevents reversed attachment of the cover 50 to the card connector 10. A pair of hooks 55 are formed by being bent downward on the rear edge of the planar surface 51 at the left and right ends.

Next, the method used to attach the cover 50 to the card connector 10 will be described. In order to attach the cover 50 to the card connector 10, it is necessary first to connect the daughter board 60 to the card connector 10. Accordingly, the connection of the daughter board 60 to the card connector 10 will be briefly described.

Figure 5:
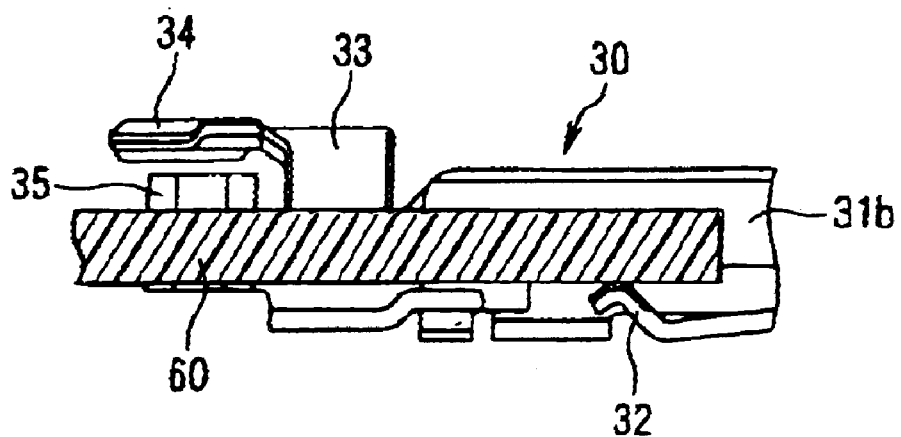
FIG. 5 is an explanatory diagram which illustrates the state of engagement of the latch members with the daughter board.
Figure 6:
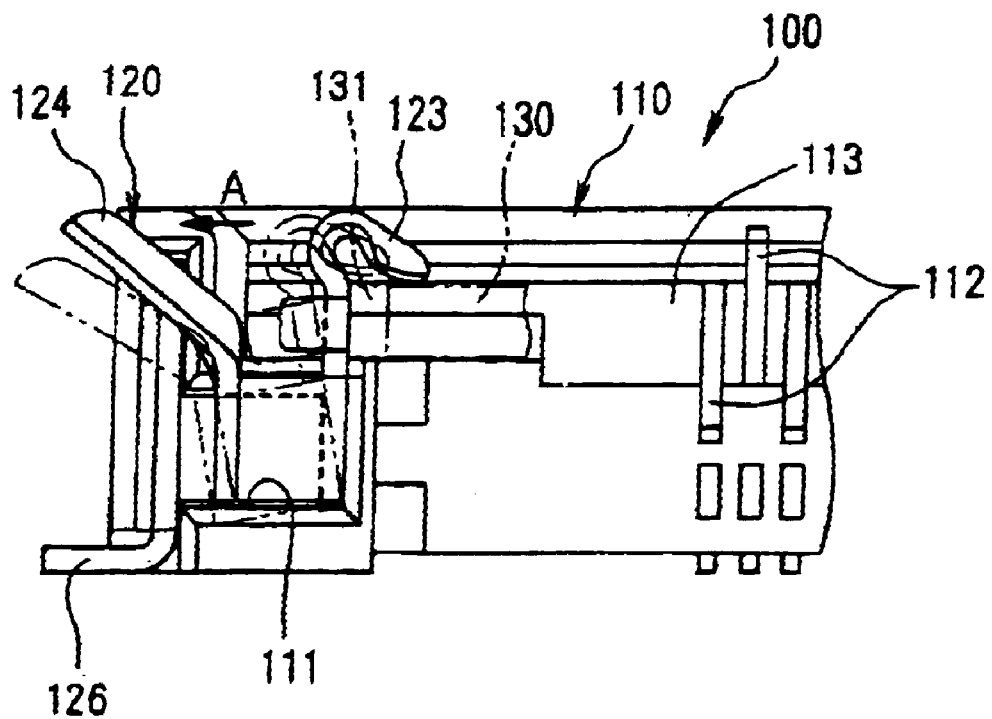
FIG. 6 shows a portion of a front view of a prior art card connector.
Figure 7:
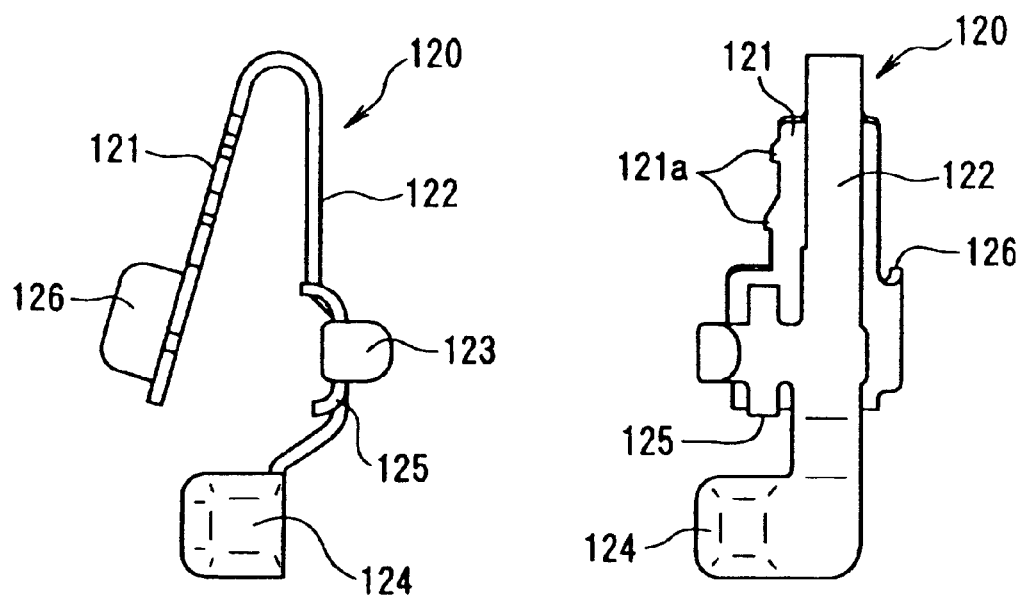
Figure 7:
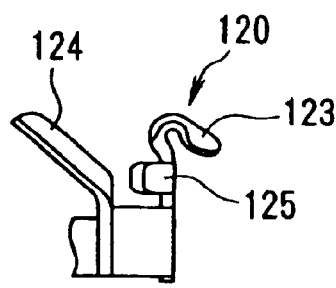

After the card connector 10 is mounted on the mother board 70, the end of the daughter board 60 is inserted from above at an angle with respect to the board receiving recess 21 shown in FIG. 1B, and the daughter board 60 is then pivoted downward. As a result, the left and right lower corner edges of the daughter board 60 contact the catches 33 of the latch member 30. As a result, the catches 33 and main bodies 31 as a whole spread to the left and right. When the daughter board 60 is further pivoted downward, the catches 33 and main bodies 31 as a whole return to their original positions as shown in FIG. 5, so that the catches 33 engage with the upper surface of the daughter board 60. In this case, the projections 35 on the latch members 30 contact the cutouts formed in the left and right edges of the daughter board, so that the daughter board 60 is prevented from slipping out. Furthermore, the ground on the undersurface of the daughter board 60 contacts the ground contacts 32 of the latch members 30 as shown in FIG. 5, so that the daughter board 60 is grounded to the mother board 70 via the latch members 30. Furthermore, it would also be possible to arrange the construction so that the ground of the daughter board 60 does not contact the latch members 30, and is therefore not grounded to the mother board 70.

When the daughter board 60 is thus connected to the card connector 10, the cover 50 is attached to the card connector 10 by locating the planar surface 51 to cover the upper surfaces of the housing 20 and the latch members 30 while aligning the hooks 55 of the cover 50 with the rear end of the housing 20. In this case, the inside surfaces of the rear end retaining plates 52a make frictional contact with the outside surfaces of the rear ends of the outside flat plates 31a, and the inside surfaces of the front end retaining plates 52b make frictional contact with the outside surfaces of the front ends of the outside flat plates 31a. As a result, the latch members 30 are fastened in place. Furthermore, when the cover 50 is attached to the card connector 10, the hooks 55 and the rear edges of the rear end retaining plates 52a contact the housing 20, so that the movement of the cover 50 in the forward-rearward direction is restricted.

When the door C of the metal casing of the electronic device is closed after the cover 50 has been attached to the card connector 10, the door C of the casing presses against the springs 56 of the cover 50, and thus helps to prevent the separation of the cover 50 from the card connector 10. Here, since the cover 50 is formed by stamping and bending a conductive metal plate, the door C of the metal casing is grounded to the mother board 70 via the cover 50 and latch members 30. Replacement of the daughter board can be accomplished after the door C is opened. The cover 50 is removed from the card connector 10, then, the latch releases 34 are pushed outward so that the catches 33 are released, and the daughter board 60 is pulled out of the card connector 10.

When an impact with a gravitational acceleration exceeding 10,000 m/s$^2$ is applied to the area around the card connector 10 as a result of the electronic device being dropped, the latch members 30 are urged outward, however, since the latch members 30 are fastened in place by the securing portions 52 of the cover 50, outward flexing of the latch members is prevented. Also, since the cover 50 is engaged by the door C of the casing via the springs 56, there is no separation of the cover 50 from the card connector 10 even if such an impact is applied.

What is claimed is:

1. A card connector cover attachable to a card connector that receives a daughter board, the card connector cover comprising:

a planar surface which substantially covers an upper surface of the card connector;

a spring extending upwardly from the planar surface, the spring having an engagement surface which is above the planar surface to engage a portion of casing of an electronic device which houses the card connector and which is positioned above the cover; and, a securing portion extending downwardly from the planar surface to engage a latch member on the card connector which engages the daughter board.

2. The card connector cover of claim 1 wherein the securing portion further comprises a rear end retaining plate fur engaging a rear surface of to latch member.

3. The card connector cover of claim 2 wherein the securing portion further comprises a front end retaining plate for engaging a front surface of the latch member.

4. The card connector cover of claim 2 wherein the securing portion further comprises a main body securing portion for engaging an upper surface of the latch member.

5. The card connector cover of claim 4 wherein the main body securing portion extends from the rear end retaining plate.

6. The card connector cover of claim 3 wherein the securing portion further comprises a latch securing portion for engaging a latch release of the latch member.

7. The card connector cover of claim 6 wherein the latch securing portion extends from the front end retaining plate.

8. The card connector cover of claim 7 wherein the latch securing portion is connected to the planar surface at an end opposite the front end retaining plate.

9. A card connector comprising:

a housing having a plurality of contacts extending into a card receiving recess;

a pair of latch members extending from opposite sides of the housing for engaging a card which is angularly inserted into the card receiving recess; and, a cover having a planar surface which substantially covers an upper surface of the card connector and the latch members; a spring extending upwardly from the planar surface to engage a portion of a casing of an electronic device which houses the card connector; and a securing portion extending downwardly from the planar surface to engage an outer surface of one of the latch members.

10. The card connector of claim 9 wherein the securing portion further comprises a rear end retaining plate for engaging a rear surface of one of the latch members.

11. The card connector of claim 10 wherein the securing portion further comprises a front end retaining plate for engaging a front surface of one of the latch members.

12. The card connector of claim 10 wherein the securing portion further comprises a main body scouring portion for engaging an upper surface of one of the latch members.

13. The card connector of claim 12 wherein the main body securing portion extends from the rear end retaining plate.

14. The card connector of claim 11 wherein the securing portion further comprises a latch scouring portion for engaging a latch release of the latch member.

15. The card connector claim 14 wherein the latch securing portion extends from the front end retaining plate.

* * * * *